(12) United States Patent
Xin

(10) Patent No.: US 7,441,178 B2
(45) Date of Patent: Oct. 21, 2008

(54) LOW COMPLEXITY DECODING OF LOW DENSITY PARITY CHECK CODES

(75) Inventor: Weizhuang Xin, Aliso Viejo, CA (US)

(73) Assignee: KeyEye Communications, Sacramento, CA (US)

( * ) Notice: Subject to any disclaimer, the term of this patent is extended or adjusted under 35 U.S.C. 154(b) by 409 days.

(21) Appl. No.: 11/064,767

(22) Filed: Feb. 24, 2005

(65) Prior Publication Data

US 2006/0190797 A1 Aug. 24, 2006

(51) Int. Cl.
*G06F 11/00* (2006.01)
(52) U.S. Cl. .................................... 714/800
(58) Field of Classification Search ................ 714/800, 714/801, 807
See application file for complete search history.

(56) References Cited

U.S. PATENT DOCUMENTS

| | | | |
|---|---|---|---|
| 6,938,196 B2 * | 8/2005 | Richardson et al. | 714/752 |
| 7,000,177 B1 * | 2/2006 | Wu et al. | 714/801 |
| 7,127,659 B2 * | 10/2006 | Richardson et al. | 714/758 |
| 7,174,495 B2 * | 2/2007 | Boutillon et al. | 714/752 |
| 2004/0148561 A1 | 7/2004 | Shen | 714/803 |
| 2005/0081128 A1 * | 4/2005 | Jones et al. | 714/700 |

OTHER PUBLICATIONS

Juntan Zhang et al., "A Modified Weighted Bit-Flipping Decoding of Low-Density Parity-Check Codes," IEEE Communications Letters, vol. 8, No. 3, Mar. 2004 pp. 165-167.

* cited by examiner

*Primary Examiner*—Shelly A Chase
(74) *Attorney, Agent, or Firm*—Lumen Patent Firm, Inc.

(57) ABSTRACT

An improved decoder and decoding method for low density parity check (LDPC) codes is provided. Decoding proceeds by repetitive message passing from a set of variable nodes to a set of check nodes, and from the check nodes back to the variable nodes. The variable node output messages include a "best guess" as to the relevant bit value, along with a weight giving the confidence in the guess (e.g., weak, medium or strong). The check node output messages have magnitudes selected from a predetermined set including neutral, weak, medium and strong magnitudes. The check node output messages tend to reinforce the status quo of the input variable nodes if the check node parity check is satisfied, and tend to flip bits in the input variable nodes if the check node parity check is not satisfied. The variable node message weights are used to determine the check node message magnitudes.

20 Claims, 3 Drawing Sheets

LOW COMPLEXITY DECODING OF LOW DENSITY PARITY CHECK CODES

FIELD OF THE INVENTION

This invention relates to decoding of low density parity check codes.

BACKGROUND

Coding is often used to reduce communication errors by deliberately introducing redundancy into a transmitted signal. When the signal is received, the redundancy introduced by the code can be used to detect and/or reduce errors. For example, a simple parity check code is obtained by transmitting blocks of N+1 bits, where N bits are data bits and one bit is a parity bit selected to make the parity of each N+1 bit block even. Such a code can provide detection, but not correction, of single bit errors. Introduction of more than one parity bit can improve code error reduction performance (e.g. by providing detection and/or correction of multiple bit errors). This code is an example of a block parity check code.

Block parity check codes can be considered more systematically in terms of a parity check matrix H. The matrix H has R rows and C columns, where C>R. Transmitted code words x are in the null space of H (i.e., Hx=0). Thus the columns of H correspond to symbols in the code word x (typically binary bits), and each row of H corresponds to a parity check condition on the code word x. Since a transmitted code word has C bits subject to R linear conditions, the data content of a code word is C−R bits if the rows of H are linearly independent. In some cases, the rows of H are not linearly independent, and in these cases the data content of a block is C−R*, where R* is the number of linearly independent rows of H (i.e., the dimension of the row space of H). When the rows of H are not linearly independent, H is transformed to an equivalent matrix $H_{enc}$ having linearly independent rows for encoding. However, the original H matrix is still used for decoding. The rate of a block code is the ratio (C−R*)/C, and is a measure of the amount of redundancy introduced by the code. For example, a rate ½ code has one parity bit for each data bit in a block, and a rate ¾ code has one parity bit for each three data bits in a block.

A parity check code is completely defined by its parity check matrix H. Accordingly, encoding can be regarded as the process of mapping a sequence of data bits to code words in the null space of H. This encoding is typically done by constructing a generator matrix G from H such that a message vector u is mapped into a code word x in the null space of H via $x^T = u^T G$. Methods for constructing G given H are known in the art. For example, if H has the form [A|I] where A has dimensions n−k by k and I is an n−k dimensional identity matrix, G has the form [I|−A]. If H does not have this special form, G can still be constructed, but will not have the form [I|−A]. Similarly, decoding can be regarded as the process of estimating which code word was transmitted, given a received code word x' which need not be in the null space of H due to transmission errors. Various methods for efficiently performing these encoding and decoding operations in practice have been developed over time.

In the course of this development, low density parity check (LDPC) codes have emerged as an especially interesting class of codes. The defining characteristic of an LDPC code is that the parity check matrix H is sparse (i.e., is mostly zeros). It is customary to use the notation LDPC(B, D) to refer to an LDPC code, where B is the total number of bits in a block, and D is the number of data bits in a block. Thus such a code has a parity check matrix H having B columns and B-D rows, if the rows are linearly independent. Some LDPC codes are referred to as "regular" codes because they have the same number $d_c$ of non-zero elements in every row of H and have the same number $d_v$ of non-zero elements in every column of H. Such codes are often referred to as $(d_v, d_c)$ LDPC codes. For example, a (3, 6) LDPC code has $d_v=3$ and $d_c=6$. In some cases, further structure has been imposed on H in order to improve encoding and/or decoding efficiency. For example, it is generally preferred for no two rows (or columns) of the H matrix to have more than one "1" in common.

The structure of regular LDPC codes can be appreciated more clearly in connection with a graph, as shown on FIG. 1. In the representation of FIG. 1, a set of variable nodes 110 and a set of check nodes 120 are defined. Each variable node is connected to $d_v$ check nodes, and each check node is connected to $d_c$ variable nodes. In the example of FIG. 1, $d_v=3$, $d_c=6$, and the connections from variable nodes to check nodes are not completely shown to preserve clarity. There is one variable node for each bit in a code word (i.e., there are C variable nodes), and there is one check node for each parity check condition defined by H (i.e., there are R check nodes). It is useful to define N(m) as the set of variable nodes connected to check node m, and M(n) as the set of check nodes connected to variable node n.

LDPC decoding can be regarded as a process of estimating values for the variable nodes given received variable data (which may have errors) subject to parity check conditions defined by each check node. Two approaches to decoding have been extensively considered: hard decision decoding and soft decision decoding. In hard decision decoding, received variable data is quantized to either of two binary values, and then error checking defined by the check nodes is performed on the quantized values. In the context of LDPC decoding, this approach includes "bit-flipping" decoding methods and majority-logic decoding methods. Suppose that a received code word has only a single bit error at variable node k. In this case, the check node conditions will be satisfied at all check nodes except for check nodes M(k). Since variable node k is the common element to all check nodes showing a violation, it should be flipped. While variations of such bit-flipping methods have been developed, a common feature of these approaches is quantization of received bit data to binary levels, followed by error correction processing.

As might be expected, such quantization of received bit data incurs a performance penalty, because information is lost. For example, if an analog signal between 0 and 1 is quantized to binary values of 0 and 1, received values of 0.51 and 0.99 are both quantized to 1. Clearly the "1" resulting from quantization of 0.51 is significantly less certain than the "1" resulting from quantization of 0.99. This performance penalty can be avoided by soft decision decoding. For LDPC codes, soft decision decoding is typically implemented as a message passing belief propagation (BP) algorithm. In such algorithms, variable messages are calculated in the variable nodes and passed to the check nodes. Next, check messages are computed in the check nodes and passed to the variable nodes. In both steps, computation of outgoing messages depends on received message inputs. These steps are repeated until a convergence condition is met (or a maximum number of iterations is reached). Soft decision decoding with a BP algorithm typically provides good performance, but such approaches tend to be more resource-intensive than hard decision approaches. Equivalently, soft decision decoding typically cannot be performed as rapidly as hard decision decoding.

This trade-off has motivated development of hybrid approaches having aspects of both hard and soft decision decoding to provide improved performance with reduced complexity. For example, weighted bit flipping (WBF) and modified WBF methods are described by Zhang and Fossorier in IEEE Comm. Lett., v8 n3, pp. 165-167, 2004. In these methods, bits are flipped responsive to calculations performed on unquantized received bits. These bit-flipping methods (as well as simple bit-flipping) typically require a search to be performed over all variable nodes. For example, in simple bit-flipping let ERR(n) be the number of parity check violations in the set of check nodes M(n) associated with variable node n. Bits corresponding to variable nodes having a maximal (or above-threshold) value of ERR(n) are flipped. In this example, a search is required to identify these variable nodes. Such a search can undesirably increase the computational resources required for decoding.

Hybrid decoding of LDPC codes is also considered in US patent application 2004/0148561, where various hybrid methods including both a bit flipping step and a belief propagation step are considered. Approaches of this kind do not provide simple implementation, since both bit-flipping and belief propagation are performed. In particular, these approaches do not alleviate the above-noted disadvantage of reduced decoding speed exhibited by conventional BP decoding.

Accordingly, it would be an advance in the art to provide hybrid decoding of LDPC codes that overcomes these disadvantages. More specifically, it would be an advance to provide a hybrid decoding method that does not require searching nodes for maximal (or above threshold) values and does not require implementation of conventional belief propagation.

SUMMARY

The present invention provides an improved decoder and decoding method for low density parity check (LDPC) codes. Decoding proceeds by repetitive message passing from a set of variable nodes to a set of check nodes, and from the check nodes back to the variable nodes. The variable node output messages include a "best guess" as to the relevant bit value, along with a weight giving the confidence in the guess (e.g., weak, medium or strong). The check node output messages have magnitudes selected from a predetermined set including neutral, weak, medium and strong magnitudes. The check node output messages tend to reinforce the status quo of the input variable nodes if the check node parity check is satisfied, and tend to flip bits in the input variable nodes if the check node parity check is not satisfied. The variable node message weights are used to determine the check node message magnitudes.

This method can be regarded as a hybrid method between conventional bit-flipping methods and conventional belief propagation (BP). More specifically, the underlying logic of the method of the present invention is bit flipping combined with the use of information (i.e., the variable message weights) giving the confidence in the bits being processed. The present invention may appear similar to BP because a message passing algorithm is employed, but the messages in the present invention are significantly simpler than in conventional BP. Furthermore, the present invention requires much less computation in the nodes (especially the check nodes) than in conventional BP.

DETAILED DESCRIPTION

Figure 2:
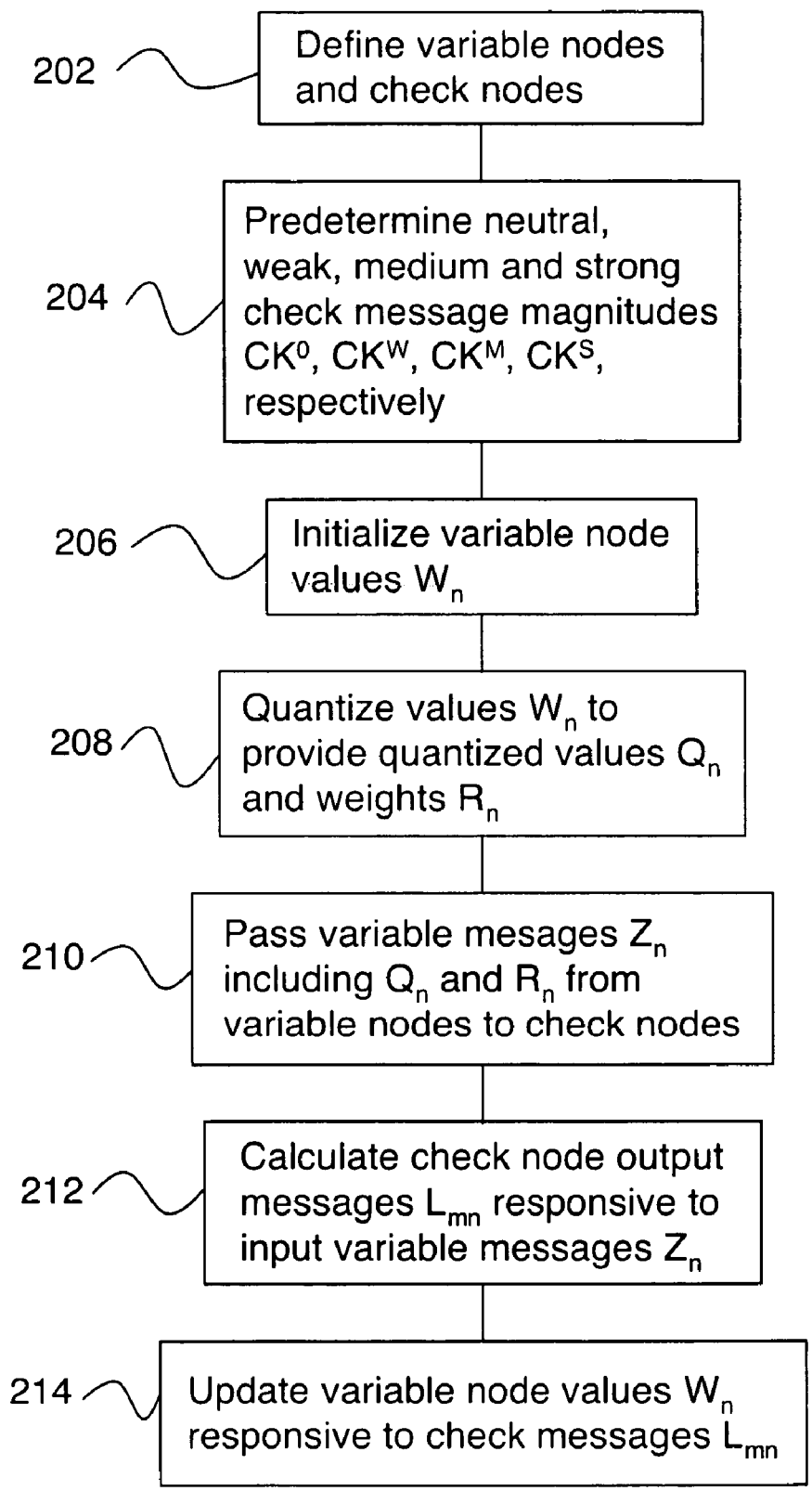
FIG. 2 shows a method for decoding an LDPC according to an embodiment of the invention.

FIG. 2 shows a method for decoding LDPC codes according to an embodiment of the invention. This method can be appreciated as an improved bit-flipping algorithm, where quantized messages are passed to carry more information than in conventional bit-flipping methods. In addition, the quantization of the messages provides significant advantages of implementation simplicity compared to conventional belief propagation decoding by message passing. These aspects of the method of FIG. 2 will be further emphasized in the following description.

Figure 1:
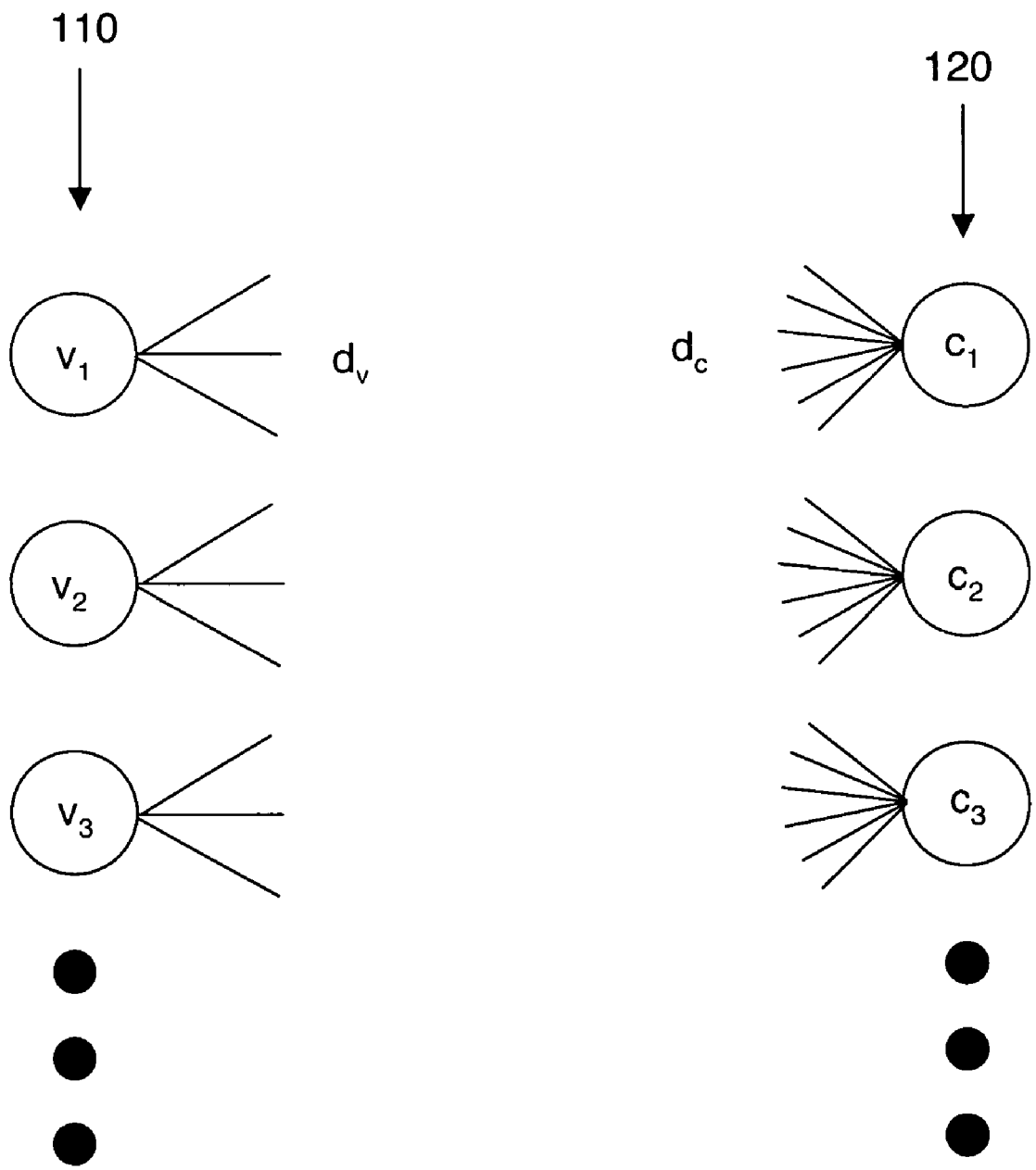
FIG. 1 shows variable nodes and check nodes of an LDPC code as known in the art.

Step 202 on FIG. 2 is defining a set of variable nodes and a set of check nodes (e.g., as shown on FIG. 1). As indicated above, there is one variable node for each symbol (typically a bit) in a code block, and there is one check node for each parity check condition (i.e., for each row of the parity check matrix H). Since code performance tends to improve as block size increases, blocks are typically quite large (e.g., several thousand bits or more). In practice, the advantages of long blocks are traded off against disadvantages such as increased decoder latency to select a block size. The variable nodes and check nodes are indexed by integers n and m respectively. The function M(n) returns the set of check nodes associated with variable node n (i.e., the parity checks relating to variable node n), and the function N(m) returns the set of variable nodes associated with check node m (i.e., included in the parity check condition for check node m). LDPC codes suitable for decoding according to the invention can be regular or irregular. Regular codes have the same number of variable nodes associated with each check node, and have the same number of check nodes associated with each variable node. Equivalently, regular codes have the same number of ones in every row of H and the same number of ones in every column of H. Irregular codes have a variable number of ones in the rows and/or columns of H. The decoding methods of the present invention are generally applicable to LDPC codes (i.e., to any code having a sparse parity check matrix H). Thus H can be any random sparse matrix. The invention is also suitable for decoding LDPC codes having special properties (i.e., additional mathematical constraints on H). Such constraints can be useful in various ways, such as facilitating encoding.

Step 204 on FIG. 2 is predetermining neutral, weak, medium and strong check message magnitudes $CK^n$, $CK^w$, $CK^m$, and $CK^s$ respectively. According to the invention, the magnitude of the check messages is quantized to be one of these predetermined magnitudes, as discussed in more detail below. Such quantization of the check messages differs significantly from conventional belief propagation, where message quantization may occur incidentally (e.g., in a digital implementation) but is not a fundamental feature of the method.

Step 206 on FIG. 2 is initializing the variable nodes. Let $W_n$ be the value of variable node n. At any point in the decoding process, the value $W_n$ is an estimate of the received symbol corresponding to variable node n. It is preferred to represent these values as log-likelihood ratios (e.g., $W_n = \log(P_0(n)/P_1(n))$, where $P_1(n)$ is the probability that bit n is a one and $P_0(n)$ is the probability that bit n is a zero. The log can be taken to any base, but the natural logarithm (i.e., base e) is preferred. The log-likelihood ratio can also be defined in terms of $P_1(n)/P_0(n)$, naturally. The values $W_n$ can also be expressed in terms of probabilities (e.g., $W_n = P_0(n)$ or $W_n = P_1(n)$), but this representation is less preferred since it tends to require more computation to decode than the log-likelihood representation. Thus, the values $W_n$ are preferably initialized to log-likelihood ratios $L_n^{(0)}$ calculated from received symbols. For example, large positive values of $L_n^{(0)}$ correspond to a high probability of a received 1, large negative values of $L_n^{(0)}$ correspond to a high probability of a received 0, and $L_n^{(0)} = 0$ if the received symbol value is at the decision threshold between 0 and 1. As another example, for transmission of $-1$ or $+1$ over a channel having additive Gaussian noise having zero mean and variance $\sigma^2$, the log-likelihood ratio $L_n^{(0)}$ is $2y/\sigma^2$ where y is the received symbol value. Suitable methods for computing $L_n^{(0)}$ from received symbol values are well known in the art.

Optionally, the initial values $L_n^{(0)}$ can be scaled by a scaling factor prior to performing the remaining steps of the decoding method. Such scaling can be regarded as a way to adjust decoding performance to match particular characteristics of the channel and/or modulation scheme being employed. As such, it is within the skill of an art worker to routinely adjust such scaling (e.g., by numerical simulation) to improve decoding performance. A scaling factor which is too large will tend to lead to overflow with associated loss of information. A scaling factor which is too small will tend to lose information by underflow or reduced precision. In typical receivers, automatic gain control is implemented to ensure input signals are within a well-defined range. Establishment of such a well-defined input signal range is helpful in selecting a suitable scaling factor for the initial values $L_n^{(0)}$. In practicing the invention, suitable scaling factors tend to be somewhat larger than in conventional decoding approaches. This difference is attributed to the weighting of variable messages as weak, medium, and strong (as discussed in detail below), and the high relative importance of weak variable messages.

Step 208 on FIG. 2 is quantizing the variable node values $W_n$. More specifically, quantization is performed relative to a decision threshold X such that a quantized value $Q_n$ is set to a predetermined value $Q^0$ if $W_n < X$ and is set to a predetermined value $Q^1$ if $W_n \leq X$. For example, in the preferred case where the values $W_n$ are log-likelihood ratios, a suitable decision threshold X is 0, and suitable values for $Q^0$ and $Q^1$ are $-1$ and 1 respectively. Thus the quantized value $Q_n$ can be regarded as the result of a hard decision. However, as indicated above, information is lost if a quantity such as $W_n$ (which can take on a range of values) is replaced with a single bit of information (e.g., $Q_n$).

According to the invention, this issue is addressed by also computing a weight $R_n$ to associate with the value $Q_n$. The weight $R_n$ takes on different values depending on how close the value $W_n$ is to the threshold X. If $W_n$ is close to X, the weight $R_n$ is "weak", since there is a relatively high probability that the corresponding value $Q_n$ is incorrect. If $W_n$ is far away from X, the weight $R_n$ is "strong", since there is a relatively low probability that the corresponding value $Q_n$ is incorrect. For intermediate cases, the weight $R_n$ is "medium".

More precisely, two weight thresholds $T_1$ and $T_2$ are defined, and $R_n$ is weak if $|W_n - X| \leq T_1$, $R_n$ is medium if $T_1 < |W_n - X| \leq T_2$, and $R_n$ is strong if $T_2 < |W_n - X|$.

Step 210 on FIG. 2 is passing messages $Z_n$ from the variable nodes to the check nodes. Each variable node n passes the same message $Z_n$ to each of its associated check nodes M(n). The variable messages $Z_n$ include the quantized values $Q_n$ and the weights $R_n$. Any mathematically unambiguous representation of $Q_n$ and $R_n$ can be used to construct the messages $Z_n$. For example, weak, medium and strong weights can correspond to $R_n$ equal to 1, 2, and 3 respectively, and $Q_n$ can take on values of $-1$ or $+1$ as above. In this representation, the messages $Z_n$ can be the product of $Q_n$ and $R_n$, since no ambiguity occurs.

Step 212 on FIG. 2 is calculating check node output messages $L_{mn}$ from each check node m to its associated variable nodes N(m). Broadly speaking, each check node message provides information to its variable nodes as to whether or not the variable node values should be changed (e.g., by tending to flip a bit) based on the parity check condition at the check node. More specifically, the check node output messages have magnitudes which are selected from the predetermined magnitudes $CK^n$, $CK^w$, $CK^m$, and $CK^s$. Strong check node messages are sent in cases where it is clear whether or not to flip a bit, weak check node messages are sent in cases where it is less clear whether or not to flip a bit, medium check node messages are sent in intermediate cases, and neutral check node messages are sent in cases where it is not clear whether or not a bit should be flipped. The determination of how clear it is whether or not to flip a bit depends on the weights $R_n$ (i.e., confidence) of the received variable node messages $Z_n$. Mathematically, the messages $L_{mn}$ are determined by a parity check function $f_{mn}[\{Z_n: n \in N(m)\}]$ of the variable messages provided to check node m.

In a preferred embodiment of the invention, the parity check function is computed according to the following method. In this preferred embodiment, we assume $Q^0 = -Q^1$ (e.g., $Q^0$ can be 1 and $Q^1$ can be $-1$, or vice versa). First, a parity check condition for check node m is checked. More specifically, a determination is made as to whether or not the quantized values $Q_n$ input to check node m satisfy the parity check condition for check node m. For example, a commonly employed parity condition is satisfied if and only if an even number of associated variable nodes have quantized values $Q_n$ equal to one. Thus, if the parity check condition is satisfied, there are either no bit errors, or an even number (e.g., 2, 4, etc.) of bit errors. If the parity check condition is not satisfied, there is an odd number (e.g., 1, 3, etc.) of bit errors. In most cases, systems are designed to have a low probability of error, which means that if parity check is satisfied, it is most probable that all bits are correct, and if parity check is violated, it is most probable that only one bit is in error. These considerations will be apparent in the following steps.

Second, the check node confidence is established. More specifically, this step entails setting a weak count $WK_m$ and a medium count $MD_m$ equal to a count of the number of weak and medium weights respectively included in the input variable messages $\{Z_n: n \in N(m)\}$ to check node m. If there is only one weak variable message, an index $n_{weak}$ is set equal to the index n of the variable node in N(m) having a weak weight. Similarly, if there is only one medium variable message, an index $n_{med}$ is set equal to the index n of the variable node in N(m) having a medium weight.

Finally, the parity check function $f_{mn}$ is computed. Two cases are distinguished. If the parity check condition is satisfied, $f_{mn}$ is computed according to $$f_{mn} = \begin{cases} Q_n CK^s & \text{if } WK_m = 0; MD_m = 0; \text{for } n \in N(m) \\ \begin{cases} Q_n CK^s \text{ for } n = n_{med} \\ Q_n CK^m \text{ for } n \neq n_{med} \end{cases} & \text{if } WK_m = 0; MD_m = 1; \text{for } n \in N(m) \\ Q_n CK^w & \text{if } WK_m = 0; MD_m \geq 2; \text{for } n \in N(m) \\ \begin{cases} Q_n CK^s \text{ for } n = n_{weak} \\ Q_n CK^w \text{ for } n \neq n_{weak} \end{cases} & \text{if } WK_m = 1; MD_m = 0; \text{for } n \in N(m) \\ Q_n CK^w & \text{if } WK_m = 1; MD_m \geq 1; \text{for } n \in N(m) \\ CK^n & \text{if } WK_m \geq 2; \text{for } n \in N(m). \end{cases} \quad (1)$$

If the parity check condition is not satisfied, $f_{mn}$ is computed according to $$f_{mn} = \begin{cases} -Q_n CK^w & \text{if } WK_m = 0; \text{for } n \in N(m) \\ \begin{cases} -Q_n CK^s \text{ for } n = n_{weak} \\ -Q_n CK^w \text{ for } n \neq n_{weak} \end{cases} & \text{if } WK_m = 1; MD_m = 0; \text{for } n \in N(m) \\ -Q_n CK^w & \text{if } WK_m = 1; MD_m \geq 1; \text{for } n \in N(m) \\ CK^n & \text{if } WK_m \geq 2; \text{for } n \in N(m). \end{cases} \quad (2)$$

Alternative forms for these equations are possible. For example, if the parity check condition is not satisfied, $f_{mn}$ can also be computed according to $$f_{mn} = \begin{cases} -Q_n CK^w & \text{if } WK_m = 0; MD_m = 0; \text{for } n \in N(m) \\ \begin{cases} -Q_n CK^s \text{ for } n = n_{med} \\ -Q_n CK^w \text{ for } n \neq n_{med} \end{cases} & \text{if } WK_m = 0; MD_m = 1; \text{for } n \in N(m) \\ -Q_n CK^w & \text{if } WK_m = 0; MD_m \geq 2; \text{for } n \in N(m) \\ \begin{cases} -Q_n CK^s \text{ for } n = n_{weak} \\ -Q_n CK^w \text{ for } n \neq n_{weak} \end{cases} & \text{if } WK_m = 1; MD_m = 0; \text{for } n \in N(m) \\ -Q_n CK^w & \text{if } WK_m = 1; MD_m \geq 1; \text{for } n \in N(m) \\ CK^n & \text{if } WK_m \geq 2; \text{for } n \in N(m). \end{cases} \quad (2a)$$

Some comparisons have been performed between decoding according to Eqs. 1 and 2 and decoding according to Eqs. 1 and 2a. In these comparisons, no significant performance difference was seen. It is helpful to regard the check node output messages as suggestions about how to modify the variable node values $W_n$ based on the messages input to the check nodes. Consideration of specific cases relating to equations 1 and 2 will clarify these equations, and also suggest further alternatives and variations of such equations to the skilled art worker.

For example, if there are two or more weak variable messages at a check node, there is not enough confidence to suggest anything definite, so neutral messages $CK^n$ are sent back. At the opposite extreme, if there are no weak or medium input messages and parity check is satisfied, everything appears to be in order and strong output messages $Q_n CK^s$ are sent back reinforcing the status quo. If there are no weak input messages and parity check is violated, something is wrong, but there is no clear single target for bit flipping, so a weak bit flipping output message $-Q_n CK^w$ is sent out. Note that a check message proportional to $Q_n$ will act to reinforce the status quo and a check message proportional to $-Q_n$ will act to change the status quo (by flipping a bit).

If parity check is satisfied, and there are no weak input messages and two or more medium input messages, everything is apparently in order, but with relatively low confidence. Therefore, weak output messages $Q_n CK^w$ are sent out reinforcing the status quo. Such messages $Q_n CK^w$ are also sent out if parity check is satisfied, there is one weak input message and one or more medium input messages. If parity check is violated and there is one weak input message and one or more medium input messages, weak bit-flipping output $-Q_n CK^w$ messages are sent out.

If parity check is violated, and there is one weak input message and no medium input messages, there is a clear indication of which bit should most probably be flipped. Accordingly, a strong bit-flipping message $-Q_n CK^s$ is sent to the weak variable node (i.e., $n=n_{weak}$), and weak bit-flipping messages $-Q_n CK^w$ are sent to the other variable nodes (i.e., $n \neq n_{weak}$). Similarly, if parity check is satisfied and there is one weak input message and no medium input messages, a strong status quo message $Q_n CK^s$ is sent to the weak variable node (i.e., $n=n_{weak}$) and weak status quo messages $Q_n CK^w$ are sent to the other variable nodes (i.e., $n \neq n_{weak}$).

Finally, if parity check is satisfied and there are no weak input messages and a single medium input message, a strong status quo message $Q_n CK^s$ is sent to the medium variable node (i.e., $n=n_{med}$) and medium status quo messages $Q_n CK^m$ are sent to the other variable nodes (i.e., $n \neq n_{med}$).

Step 214 on FIG. 2 is updating the variable node values $W_n$ responsive to the check messages $L_{mn}$. In the preferred representation where the variable values $W_n$ are log-likelihood ratios, this updating is calculated according to $$W_n = L_n^{(0)} = \sum_{m \in M(n)} L_{mn}. \quad (3)$$

Thus $W_n$ is updated to be the sum of the initial estimate $L_n^{(0)}$ and all of the messages $L_{mn}$ from the associated check nodes $M(n)$. Here the effect of the check message magnitudes can be most clearly appreciated. For example, one possible assignment of check message magnitudes is $CK^n=0$, $CK^w=1$, $CK^m=2$ and $CK^s=3$. Thus a neutral message has no effect on a variable node it is sent to, and the effect of the other messages is larger for strong than for medium, and larger for medium than for weak.

In an alternative embodiment of the invention, the updating of variable node values is calculated according to $$W_n = f(PCC) + L_n^{(0)} + \sum_{m \in M(n)} L_{mn} \quad (3a)$$

where PCC is a parity check count and f(PCC) is a function of this parity check count. More specifically, PCC is the number of parity errors present in the set of check nodes M(n) associated with variable node n. For example, |f(PCC)| can be one if PCC is one or less, and f(PCC) can be zero if PCC is two or greater. The sign of f(PCC) is selected to reinforce the value of $W_n$ (i.e., is the same as the sign of $$L_n^{(0)} + \sum_{m \in M(n)} L_{mn}).$$

In this manner, variable nodes having a small number of parity errors in their associated check nodes have their values increased, which tends to increase the confidence weights assigned to these variable nodes. The use of this f(PCC) in cases otherwise similar to the examples of FIGS. 3-5 has improved performance by about 0.15 dB. Other functions f(PCC) having the same general characteristics may be more suitable than this exemplary f(PCC) for certain cases, and it is within the skill of an art worker to determine such functions (e.g., by performing routine numerical simulations).

Steps 208, 210, 212 and 214 are repeated in sequence until a termination condition is satisfied. The termination condition can be satisfaction of the parity check condition at all check nodes. The termination condition can also be completion of a predetermined number of iterations of this sequence. A preferred termination condition is to end decoding if all parity check conditions are satisfied, or if a maximum number of iterations is reached, whichever happens first.

Several advantages of the present invention are evident from the preceding exemplary description of a preferred embodiment. In particular, no search is required of either the variable nodes or check nodes, which is a significant advantage compared to some conventional bit flipping methods. Furthermore, the decoding computations of the present invention are much simpler than the computations of conventional belief propagation decoding (especially in the check nodes).

Figure 3:
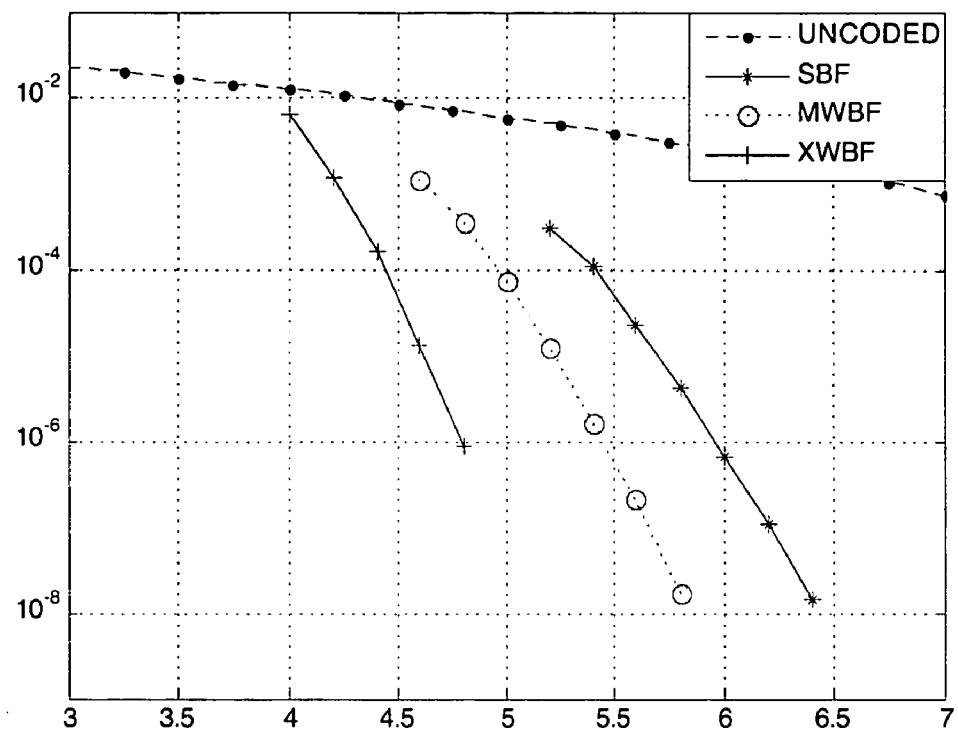
FIG. 3 shows examples of LDPC(1024, 833) decoding performance, including an embodiment of the invention, for BPSK modulation.
Figure 4:
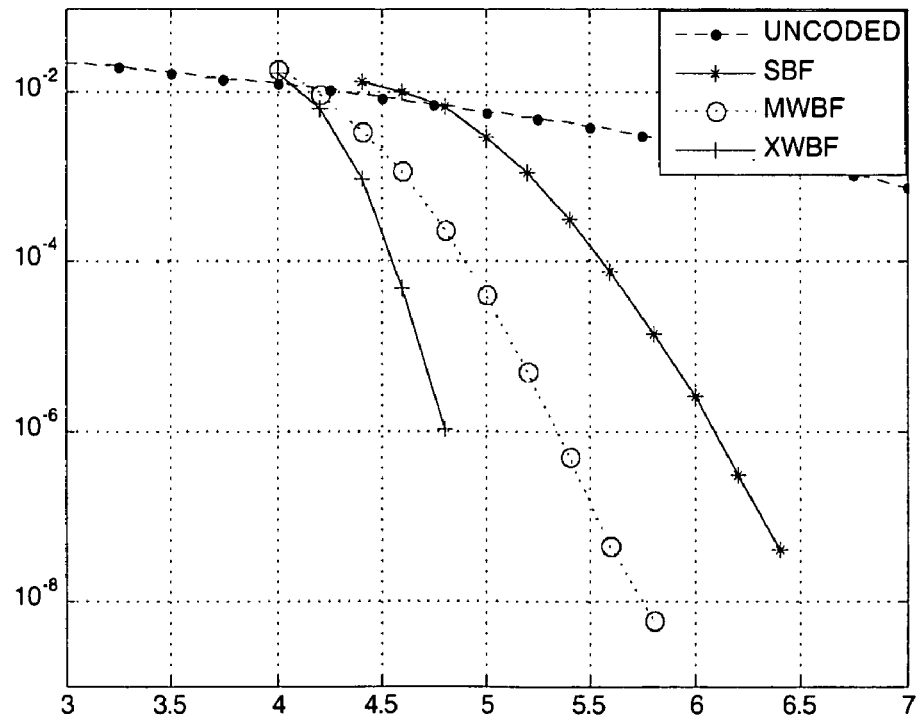
FIG. 4 shows examples of LDPC(2048, 1723) decoding performance, including an embodiment of the invention, for BPSK modulation.

FIGS. 3-4 show simulated decoding performance for various LDPC decoding methods, including embodiments of the present invention, for an additive white Gaussian noise channel. On these plots, SBF refers to the simple bit-flipping method, MWBF refers to modified weighted bit flipping as discussed above, and XWBF refers to decoding according to embodiments of the present invention. For these examples, decoding is performed according to Equations 1, 2, and 3. In these embodiments, the log-likelihood representation for $W_n$ is used, and the decoding parameters are set as follows: $CK^n=0$, $CK^w=1$, $CK^m=2$, $CK^s=3$, $Z=0$, $T_1=2$, $T_2=7$, $Q^0=1$, and $Q^1=-1$. Although these parameter values have been found suitable for these examples, adjustment of these values is likely to be necessary to obtain optimal results for various other channels and/or modulation schemes. Such adjustment is routine, and well within the skill of an art worker. For example, numerical simulations are suitable for optimizing numerical decoding parameters.

The weak message threshold $T_1$ is noteworthy. If it is too high, then too many variable messages will be classified as weak. In particular, every check node may have two or more weak input messages. Such a state is undesirable, since all check messages will be neutral, and decoding will therefore make no progress. Thus the threshold $T_1$ should be set low enough so that this does not occur. Alternatively, an input scaling factor can be increased, such that the same threshold $T_1$ is relatively smaller compared to typical variable node values.

Modulation formats having more than one bit of information per symbol can be used with binary LDPC codes in known ways. For example, a modulation format having four levels 0, 1, 2, and 3 (i.e., PAM-4) can be mapped into bit patterns 00, 01, 11, and 10 respectively, which can be encoded, transmitted and decoded using a binary LDPC code. On FIGS. 3-4, the vertical axis is bit error rate, and the horizontal axis is $E_b/N_0$, where $E_b$ is the bit energy and $N_0$ is the noise power spectral density. The examples of FIGS. 3-4 all relate to binary phase shift keying (BPSK) modulation.

FIG. 3 shows LDPC(1024,833) decoding performance for BPSK modulation, and FIG. 4 shows LDPC(2048, 1723) decoding performance for BPSK modulation. The codes for FIGS. 3 and 4 are regular LDPC codes. For the LDPC(1024, 833) code of FIG. 3, dv=10 and dc=32. For the LDPC(2048, 1723) code of FIG. 4, dv=6 and dc=32. All decoding methods were computed with 3-bit fixed point quantization of log-likelihood ratios. In both examples, the performance of the present invention (i.e., XWBF) is better than the bit flipping methods (i.e., more than 1 dB better than SBF and more than 0.7 dB better than MWBF) Thus an advantage of the present invention is to provide decoding performance that is better than conventional bit flipping methods without being computationally demanding.

The preceding description is by way of example as opposed to limitation. Accordingly, many variations of the above examples also fall within the scope of the invention. For example, the preceding description is in terms of log-likelihood ratios. A mathematically equivalent formulation in terms of probabilities (as known in the art for conventional LDPC decoding) can also be employed to practice the invention.

In the preceding description, inequalities were used to define ranges. For completeness, the case of mathematical equality was explicitly provided for (e.g., as in "$R_n$ is medium if $T_1 < |W_n - X| \leq T_2$"). The seemingly different "$R_n$ is medium if $T_1 \leq |W_n - X| < T_2$" is essentially equivalent to the preceding quote. Thresholds such as $T_1$ and $T_2$ will typically be set by a process of numerical experimentation, which can be performed with any consistent arrangement of the equality conditions.

The preceding description has focused on decoding methods according to the invention. A decoder according to the invention includes a processor which carries out the steps of a method of the invention. Such a processor can be implemented in any combination of hardware and/or software. Numerical calculations in such a processor can be performed in a fixed point representation and/or in a floating point representation. A preferred embodiment of a decoder of the invention is implemented in VLSI circuitry to maximize decoding speed.

What is claimed is:

1. A decoder for a low density parity check code having a processor providing a method comprising:

a) defining a set of variable nodes indexed by an integer n and a set of check nodes indexed by an integer m, wherein each variable node n is associated with a set of check nodes M(n) and each check node m is associated with a set of variable nodes N(m);

b) predetermining a neutral check message magnitude $CK^n$, a weak check message magnitude $CK^w$, a medium check message magnitude $CK^m$ and a strong check message magnitude $CK^s$;

c) initializing all of the variable nodes to have values $W_n$ equal to initial values $L_n^{(0)}$ computed from received symbols;

d) quantizing each variable node value $W_n$ with respect to a decision threshold $X$ and weight thresholds $T_1$ and $T_2$ to provide a quantized value $Q_n$ and a weight $R_n$, wherein $Q_n$ is selected from predetermined values $Q^0$ and $Q^1$, wherein $Q_n = Q^0$ if $W_n < X$ and $Q_n = Q^1$ if $W_n \geq X$, and wherein $R_n$ is weak if $|W_n - X| \leq T_1$, $R_n$ is medium if $T_1 < |W_n - X| \leq T_2$, and $R_n$ is strong if $T_2 < |W_n - X|$;

e) providing a variable message $Z_n$ from each variable node n to each of the corresponding set of check nodes M(n), wherein the variable message $Z_n$ includes the quantized value $Q_n$ and the weight $R_n$;

f) calculating a check node output message $L_{mn}$ from each check node m to each of the corresponding set of variable nodes N(m), wherein $L_{mn}$ is determined by a parity check function $f_{mn}[\{Z_n: n \in N(m)\}]$ of the variable messages provided to check node m and wherein $L_{mn}$ depends partly on the predetermined check message magnitudes $CK^n$, $CK^w$, $CK^m$ and $CK^s$;

g) updating the variable node values $W_n$ based on the check node output messages $L_{mn}$;

h) repeating steps (d) through (g) above in sequence until a termination condition is satisfied;

i) providing said updated variable node values $W_n$ as an output estimate of transmitted symbols corresponding to said received symbols.

2. The decoder of claim 1, wherein said termination condition is satisfied when a parity check condition is satisfied at all of said check nodes.

3. The decoder of claim 1, wherein said termination condition is satisfied when a predetermined number of iterations of said step (h) have been completed.

4. The decoder of claim 1, wherein said initial values $L_n^{(0)}$ are estimated log-likelihood ratios of received symbols.

5. The decoder of claim 1, wherein said updating the variable node values $W_n$ comprises updating according to $$W_n = L_n^{(0)} + \sum_{m \in M(n)} L_{mn}.$$

6. The decoder of claim 1, wherein a parity check count PCC of the number of check nodes in the set M(n) that do not satisfy their respective parity check conditions is calculated, and wherein said updating the variable node values $W_n$ comprises updating according to $$W_n = f(PCC) + L_n^{(0)} + \sum_{m \in M(n)} L_{mn},$$

wherein f(PCC) is a function of said parity check count.

7. The decoder of claim 1, wherein $Q^0 = -Q^1$, and wherein said check function $f_{mn}[\{Z_n: n \in N(m)\}]$ is determined by a method comprising:

1) determining whether or not a parity check condition for check node m is satisfied by the quantized values $\{Q_n: n \in N(m)\}$ input to check node m;

2) setting a weak count $WK_m$ equal to a count of the number of weak weights included in the variable messages $\{Z_n: n \in N(m)\}$, wherein if $WK_m = 1$ an index $n_{weak}$ is set equal to the index n of the variable node in N(m) having a weak weight;

3) setting a medium count MDm equal to a count of the number of medium weights included in the variable messages $\{Z_n: n \in N(m)\}$, wherein if $MD_m = 1$ an index $n_{med}$ is set equal to the index n of the variable node in N(m) having a medium weight;

4) calculating $f_{mn}$ according to $$f_{mn} = \begin{cases} Q_n CK^s & \text{if } WK_m = 0; MD_m = 0; \text{ for } n \in N(m) \\ \begin{cases} Q_n CK^s \text{ for } n = n_{med} \\ Q_n CK^m \text{ for } n \neq n_{med} \end{cases} & \text{if } WK_m = 0; MD_m = 1; \text{ for } n \in N(m) \\ Q_n CK^w & \text{if } WK_m = 0; MD_m \geq 2; \text{ for } n \in N(m) \\ \begin{cases} Q_n CK^s \text{ for } n = n_{weak} \\ Q_n CK^w \text{ for } n \neq n_{weak} \end{cases} & \text{if } WK_m = 1; MD_m = 0; \text{ for } n \in N(m) \\ Q_n CK^w & \text{if } WK_m = 1; MD_m \geq 1; \text{ for } n \in N(m) \\ CK^n & \text{if } WK_m \geq 2; \text{ for } n \in N(m) \end{cases}$$

if the parity check condition is satisfied;

5) calculating $f_{mn}$ according to $$f_{mn} = \begin{cases} -Q_n CK^w & \text{if } WK_m = 0; \text{ for } n \in N(m) \\ \begin{cases} -Q_n CK^s \text{ for } n = n_{weak} \\ -Q_n CK^w \text{ for } n \neq n_{weak} \end{cases} & \text{if } WK_m = 1; MD_m = 0; \text{ for } n \in N(m) \\ -Q_n CK^w & \text{if } WK_m = 1; MD_m \geq 1; \text{ for } n \in N(m) \\ CK^n & \text{if } WK_m \geq 2; \text{ for } n \in N(m) \end{cases}$$

if the parity check condition is not satisfied.

8. The decoder of claim 1, wherein $Q^0 = -Q^1$, and wherein said check function $f_{mn}[\{Z_n: n \in N(m)\}]$ is determined by a method comprising:

1) determining whether or not a parity check condition for check node m is satisfied by the quantized values $\{Q_n: n \in N(m)\}$ input to check node m;

2) setting a weak count $WK_m$ equal to a count of the number of weak weights included in the variable messages $\{Z_n: n \in N(m)\}$, wherein if $WK_m = 1$ an index $n_{weak}$ is set equal to the index n of the variable node in N(m) having a weak weight;

3) setting a medium count $MD_m$ equal to a count of the number of medium weights included in the variable messages $\{Z_n: n \in N(m)\}$, wherein if $MD_m = 1$ an index $n_{med}$ is set equal to the index n of the variable node in N(m) having a medium weight;

4) calculating $f_{mn}$ according to $$f_{mn} = \begin{cases} Q_n CK^s & \text{if } WK_m = 0; MD_m = 0; \text{for } n \in N(m) \\ \begin{cases} Q_n CK^s \text{ for } n = n_{med} \\ Q_n CK^m \text{ for } n \neq n_{med} \end{cases} & \text{if } WK_m = 0; MD_m = 1; \text{for } n \in N(m) \\ Q_n CK^w & \text{if } WK_m = 0; MD_m \geq 2; \text{for } n \in N(m) \\ \begin{cases} Q_n CK^s \text{ for } n = n_{weak} \\ Q_n CK^w \text{ for } n \neq n_{weak} \end{cases} & \text{if } WK_m = 1; MD_m = 0; \text{for } n \in N(m) \\ Q_n CK^w & \text{if } WK_m = 1; MD_m \geq 1; \text{for } n \in N(m) \\ CK^n & \text{if } WK_m \geq 2; \text{for } n \in N(m) \end{cases}$$

if the parity check condition is satisfied;

5) calculating $f_{mn}$ according to $$f_{mn} = \begin{cases} -Q_n CK^w & \text{if } WK_m = 0; MD_m = 0; \text{for } n \in N(m) \\ \begin{cases} -Q_n CK^s \text{ for } n = n_{med} \\ -Q_n CK^w \text{ for } n \neq n_{med} \end{cases} & \text{if } WK_m = 0; MD_m = 1; \text{for } n \in N(m) \\ -Q_n CK^w & \text{if } WK_m = 0; MD_m \geq 2; \text{for } n \in N(m) \\ \begin{cases} -Q_n CK^s \text{ for } n = n_{weak} \\ -Q_n CK^w \text{ for } n \neq n_{weak} \end{cases} & \text{if } WK_m = 1; MD_m = 0; \text{for } n \in N(m) \\ -Q_n CK^w & \text{if } WK_m = 1; MD_m \geq 1; \text{for } n \in N(m) \\ CK^n & \text{if } WK_m \geq 2; \text{for } n \in N(m) \end{cases}$$

if the parity check condition is not satisfied.

9. The decoder of claim 8, wherein said threshold $T_1$ is selected to ensure that at least one of said check nodes receives less than two variable messages having a weak weight.

10. The decoder of claim 8, wherein said variable node values $W_n$ are log-likelihood ratios, and wherein $CK^n=0$, $CK^w=1$, $CK^m=2$, $CK^s=3$, $X=0$, $T_1=2$, $T_2=7$, $Q^0=1$, and $Q^1=-1$.

11. A method for decoding a low density parity check code, the method comprising:
  a) defining a set of variable nodes indexed by an integer n and a set of check nodes indexed by an integer m, wherein each variable node n is associated with a set of check nodes M(n) and each check node m is associated with a set of variable nodes N(m);
  b) predetermining a neutral check message magnitude $CK^n$, a weak check message magnitude $CK^w$, a medium check message magnitude $CK^m$ and a strong check message magnitude $CK^s$;
  c) initializing all of the variable nodes to have values $W_n$ equal to initial values $L_n^{(0)}$ computed from received symbols;
  d) quantizing each variable node value $W_n$ with respect to a decision threshold X and weight thresholds $T_1$ and $T_2$ to provide a quantized value $Q_n$ and a weight $R_n$, wherein $Q_n$ is selected from predetermined values $Q^0$ and $Q^1$, wherein $Q_n=Q^0$ if $W_n<X$ and $Q_n=Q^1$ if $W_n \geq X$, and wherein $R_n$ is weak if $|W_n-X| \leq T_1$, $R_n$ is medium if $T_1 < |W_n-X| \leq T_2$, and $R_n$ is strong if $T_2 < |W_n-X|$;
  e) providing a variable message $Z_n$ from each variable node n to each of the corresponding set of check nodes M(n), wherein the variable message $Z_n$ includes the quantized value $Q_n$ and the weight $R_n$;
  f) calculating a check node output message $L_{mn}$, from each check node m to each of the corresponding set of variable nodes N(m), wherein $L_{mn}$ is determined by a parity check function $f_{mn}[\{Z_n: n \in N(m)\}]$ of the variable messages provided to check node m and wherein $L_{mn}$ depends partly on the predetermined check message magnitudes $CK^n$, $CK^w$, $CK^m$ and $CK^s$;
  g) updating the variable node values $W_n$ based on the check node output messages $L_{mn}$;
  h) repeating steps (d) through (g) above in sequence until a termination condition is satisfied;
  i) providing said updated variable node values $W_n$ as an output estimate of transmitted symbols corresponding to said received symbols.

12. The method of claim 11, wherein said termination condition is satisfied when a parity check condition is satisfied at all of said check nodes.

13. The method of claim 11, wherein said termination condition is satisfied when a predetermined number of iterations of said step (h) have been completed.

14. The method of claim 11, wherein said initial values $L_n^{(0)}$ are estimated log-likelihood ratios of received symbols.

15. The method of claim 11, wherein said updating the variable node values $W_n$ comprises updating according to $$W_n = L_n^{(0)} + \sum_{m \in M(n)} L_{mn}.$$

16. The method of claim 11, wherein a parity check count PCC of the number of check nodes in the set M(n) that do not satisfy their respective parity check conditions is calculated, and wherein said updating the variable node values $W_n$ comprises updating according to $$W_n = f(PCC) + L_n^{(0)} + \sum_{m \in M(n)} L_{mn},$$

wherein f(PCC) is a function of said parity check count.

17. The method of claim 11, wherein $Q^0=-Q^1$, and wherein said check function $f_{mn}[\{Z_n: n \in N(m)\}]$ is determined by a method comprising:
  1) determining whether or not a parity check condition for check node m is satisfied by the quantized values $\{Q_n: n \in N(m)\}$ input to check node m;
  2) setting a weak count $WK_m$ equal to a count of the number of weak weights included in the variable messages $\{Z_n: n \in N(m)\}$, wherein if $WK_m=1$ an index $n_{weak}$ is set equal to the index n of the variable node in N(m) having weak weight;
  3) setting a medium count $MD_m$ equal to a count of the number of medium weights included in the variable messages $\{Z_n: n \in N(m)\}$, wherein if $MD_m=1$ an index $n_{med}$ is set equal to the index n of the variable node in N(m) having a medium weight;

4) calculating $f_{mn}$ according to $$f_{mn} = \begin{cases} Q_n CK^s & \text{if } WK_m = 0; MD_m = 0; \text{for } n \in N(m) \\ \begin{cases} Q_n CK^s \text{ for } n = n_{med} \\ Q_n CK^m \text{ for } n \neq n_{med} \end{cases} & \text{if } WK_m = 0; MD_m = 1; \text{for } n \in N(m) \\ Q_n CK^w & \text{if } WK_m = 0; MD_m \geq 2; \text{for } n \in N(m) \\ \begin{cases} Q_n CK^s \text{ for } n = n_{weak} \\ Q_n CK^w \text{ for } n \neq n_{weak} \end{cases} & \text{if } WK_m = 1; MD_m = 0; \text{for } n \in N(m) \\ Q_n CK^w & \text{if } WK_m = 1; MD_m \geq 1; \text{for } n \in N(m) \\ CK^n & \text{if } WK_m \geq 2; \text{for } n \in N(m) \end{cases}$$

if the parity check condition is satisfied;

5) calculating $f_{mn}$ according to $$f_{mn} = \begin{cases} -Q_n CK^w & \text{if } WK_m = 0; \text{for } n \in N(m) \\ \begin{cases} -Q_n CK^s \text{ for } n = n_{weak} \\ -Q_n CK^w \text{ for } n \neq n_{weak} \end{cases} & \text{if } WK_m = 1; MD_m = 0; \text{for } n \in N(m) \\ -Q_n CK^w & \text{if } WK_m = 1; MD_m \geq 1; \text{for } n \in N(m) \\ CK^n & \text{if } WK_m \geq 2; \text{for } n \in N(m) \end{cases}$$

if the parity check condition is not satisfied.

18. The method of claim 11, wherein $Q^0=-Q^1$, and wherein said check function $f_{mn}[\{Z_n: n \in N(m)\}]$ is determined by a method comprising:

1) determining whether or not a parity check condition for check node m is satisfied by the quantized values $\{Q_n: n \in N(m)\}$ input to check node m;

2) setting a weak count $WK_m$ equal to a count of the number of weak weights included in the variable messages $\{Z_n: n \in N(m)\}$, wherein if $WK_m=1$ an index $n_{weak}$ is set equal to the index n of the variable node in N(m) having a weak weight;

3) setting a medium count $MD_m$ equal to a count of the number of medium weights included in the variable messages $\{Z_n: n \in N(m)\}$, wherein if $MD_m=1$ an index $n_{med}$ is set equal to the index n of the variable node in N(m) having a medium weight;

4) calculating $f_{mn}$ according to $$f_{mn} = \begin{cases} Q_n CK^s & \text{if } WK_m = 0; MD_m = 0; \text{for } n \in N(m) \\ \begin{cases} Q_n CK^s \text{ for } n = n_{med} \\ Q_n CK^m \text{ for } n \neq n_{med} \end{cases} & \text{if } WK_m = 0; MD_m = 1; \text{for } n \in N(m) \\ Q_n CK^w & \text{if } WK_m = 0; MD_m \geq 2; \text{for } n \in N(m) \\ \begin{cases} Q_n CK^s \text{ for } n = n_{weak} \\ Q_n CK^w \text{ for } n \neq n_{weak} \end{cases} & \text{if } WK_m = 1; MD_m = 0; \text{for } n \in N(m) \\ Q_n CK^w & \text{if } WK_m = 1; MD_m \geq 1; \text{for } n \in N(m) \\ CK^n & \text{if } WK_m \geq 2; \text{for } n \in N(m) \end{cases}$$

if the parity check condition is satisfied;

5) calculating $f_{mn}$ according to $$f_{mn} = \begin{cases} -Q_n CK^w & \text{if } WK_m = 0; MD_m = 0; \text{for } n \in N(m) \\ \begin{cases} -Q_n CK^s \text{ for } n = n_{med} \\ -Q_n CK^w \text{ for } n \neq n_{med} \end{cases} & \text{if } WK_m = 0; MD_m = 1; \text{for } n \in N(m) \\ -Q_n CK^w & \text{if } WK_m = 0; MD_m \geq 2; \text{for } n \in N(m) \\ \begin{cases} -Q_n CK^s \text{ for } n = n_{weak} \\ -Q_n CK^w \text{ for } n \neq n_{weak} \end{cases} & \text{if } WK_m = 1; MD_m = 0; \text{for } n \in N(m) \\ -Q_n CK^w & \text{if } WK_m = 1; MD_m \geq 1; \text{for } n \in N(m) \\ CK^n & \text{if } WK_m \geq 2; \text{for } n \in N(m) \end{cases}$$

if the parity check condition is not satisfied.

19. The method of claim 18, wherein said threshold $T_1$ is selected to ensure that at least one of said check nodes receives less than two variable messages having a weak weight.

20. The method of claim 18, wherein said variable node values $W_n$ are log-likelihood ratios, and wherein $CK^n=0$, $CK^w=1$, $CK^m=2$, $CK^s=3$, $X=0$, $T_1=2$, $T_2=7$, $Q^0=1$, and $Q^1=-1$.

* * * * *